(12) United States Patent
Liu

(10) Patent No.: US 10,359,704 B2
(45) Date of Patent: Jul. 23, 2019

(54) LITHOGRAPHY MODEL FOR THREE-DIMENSIONAL PATTERNING DEVICE

(71) Applicant: ASML Netherlands B.V., Veldhoven (NL)

(72) Inventor: Peng Liu, Sunnyvale, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 14/766,408

(22) PCT Filed: Feb. 4, 2014

(86) PCT No.: PCT/EP2014/052109
§ 371 (c)(1),
(2) Date: Aug. 6, 2015

(87) PCT Pub. No.: WO2014/127985
PCT Pub. Date: Aug. 28, 2014

(65) Prior Publication Data
US 2015/0378264 A1 Dec. 31, 2015

Related U.S. Application Data

(60) Provisional application No. 61/768,228, filed on Feb. 22, 2013.

(51) Int. Cl.
*G03F 7/20* (2006.01)
(52) U.S. Cl.
CPC ............ *G03F 7/7055* (2013.01); *G03F 7/705* (2013.01); *G03F 7/70441* (2013.01)

(58) Field of Classification Search
CPC ..... G03F 7/70441; G03F 7/705; G03F 7/7055
See application file for complete search history.

(56) References Cited

U.S. PATENT DOCUMENTS

| 5,229,872 A | 7/1993 | Mumola |
| 5,296,891 A | 3/1994 | Vogt et al. |

(Continued)

FOREIGN PATENT DOCUMENTS

| CN | 1043805 | 7/1990 |
| CN | 1424743 | 6/2003 |

(Continued)

OTHER PUBLICATIONS

Chinese Office Action dated May 30, 2016 in corresponding Chinese Patent Application No. 201480009909.1.

(Continued)

*Primary Examiner* — Nha T Nguyen
(74) *Attorney, Agent, or Firm* — Pillsbury Winthrop Shaw Pittman LLP

(57) ABSTRACT

A computer-implemented method for simulating a scattered radiation field of a patterning device including one or more features, in a lithographic projection apparatus, the method including: determining a scattering function of the patterning device using one or more scattering functions of feature elements of the one or more features; wherein at least one of the one or more features is a three-dimensional feature, or the one or more scattering functions characterize scattering of incident radiation fields at a plurality of incident angles on the feature elements.

20 Claims, 16 Drawing Sheets

(56) References Cited

U.S. PATENT DOCUMENTS

| | | | |
|---|---|---|---|
| 5,523,193 | A | 6/1996 | Nelson |
| 5,969,441 | A | 10/1999 | Loopstra et al. |
| 6,046,792 | A | 4/2000 | Van Der Werf et al. |
| 7,003,758 | B2 | 2/2006 | Ye et al. |
| 7,587,704 | B2 | 9/2009 | Ye et al. |
| 7,703,069 | B1 | 4/2010 | Liu et al. |
| 8,200,468 | B2 | 6/2012 | Ye et al. |
| 8,352,885 | B2 | 1/2013 | Liu et al. |
| 8,589,829 | B2 | 11/2013 | Liu et al. |
| 8,786,824 | B2 | 7/2014 | Hansen |
| 2006/0248498 | A1* | 11/2006 | Sezginer .......... G03F 1/36 716/53 |
| 2007/0253637 | A1 | 11/2007 | Adam |
| 2009/0217233 | A1* | 8/2009 | Mimotogi .......... G03F 1/144 716/55 |
| 2010/0315614 | A1 | 12/2010 | Hansen |
| 2013/0080982 | A1* | 3/2013 | Word .......... G03F 7/70433 716/53 |

FOREIGN PATENT DOCUMENTS

| | | |
|---|---|---|
| CN | 1680187 | 10/2005 |
| CN | 101329773 | 12/2008 |
| CN | 101573665 | 11/2009 |
| CN | 102540747 | 7/2012 |
| JP | 2009-026836 | 2/2009 |
| JP | 2010-002772 | 1/2010 |
| WO | 2010/059954 | 5/2010 |

OTHER PUBLICATIONS

International Search Report dated May 20, 2014 in corresponding International Patent Application No. PCT/EP2014/052109.

C. Spence, "Full-Chip Lithography Simulation and Design Analysis—How OPC is changing IC Design," Proc. of SPIE, vol. 5751, pp. 1-14 (2005).

Yu Cao et al., "Optimized Hardware and Software for Fast, Full Chip Simulation," Proc. of SPIE, vol. 5754, pp. 407-414 (2005).

Alan E. Rosenbluth et al., "Optimum mask and source patterns to print a given shape," J. Microlith., Microfab., Microsyst., vol. 1, No. 1, pp. 13-30 (Apr. 2002).

Yuri Granik, "Source optimization for image fidelity and throughput," J. Microlith., Microfab., Microsyst., vol. 3, No. 4, pp. 509-522 (Oct. 2004).

Robert Socha et al., "Simultaneous Source Mask Optimization (SMO)," Proc. of SPIE, vol. 5853, pp. 180-193 (2005).

Peng Liu, "Accurate prediction of 3D mask topography induced best focus variation in full-chip photolithography applications," Proc. of SPIE, vol. 8166, pp. 816640-1-816640-8 (2011).

Konstantinos Adam et al., "Hybrid Hopkins-Abbe Method for Modeling Oblique Angle Mask Effects in OPC," Proc. of SPIE, vol. 6924, pp. 69241E-1 69241E-12 (2008).

Peng Liu et al., "Fast 3D thick mask model for full-chip EUVL simulations," Proc. of SPIE, vol. 8679, pp. 86790W-1-86790W-16 (Apr. 1, 2013).

Hongbo Zhang et al., "An Accurate ILT-Enabling Full-Chip Mask 3D Model for All-Angle Patterns," Proc. of SPIE, vol. 8880, pp. 88800G-1-88800G-10 (Sep. 10, 2013).

Hongbo Zhang et al., "Efficient Full-chip Mask 3D Model for Off-Axis Illumination," Proc. of SPIE, vol. 8880, pp. 888023-1-888023-9 (Sep. 10, 2013).

Peng Liu et al., "Fast 3D thick mask model for full-chip EUVL simulations," SPIE Advanced Lithography Presentation, Slides 1-21 (Feb. 24, 2013).

Peng Liu et al., "Fast and accurate 3D mask model for full-chip OPC and verification," Proc. of SPIE, vol. 6520, pp. 65200R-1-65200R-12 (2007).

Hans-Jürgen Stock et al., "Virtual Fab Flow for Wafer Topography Aware OPC," Proc. of SPIE, vol. 7640, pp. 76401U-1-76401U-12 (2010).

Nikolay Voznesenskiy et al., "Large Scale Model of Wafer Topography Effects," Proc. of SPIE, vol. 7973, pp. 79732G-1-79732G-8 (2011).

Frank Staals et al., "Advanced Wavefront Engineering for Improved Imaging and Overlay Applications on a 1.35 NA Immersion Scanner," Proc. of SPIE vol. 7973, pp. 79731G-1-79731G-13 (2011).

Jo Finders et al., "Mask 3D effects: impact on Imaging and Placement," Proc. of SPIE, vol. 7985, pp. 79850I-1-79850I-23 (2011).

Hoyoung Kang et al., "EUV simulation extension study for mask shadowing effect and its correction," Proc. SPIE, vol. 6921, pp. 69213I-1-69213I-11 (2008).

Gregory McIntyre et al., "Modeling and Experiments of Non-Telecentric Thick Mask Effects for EUV Lithography," Proc. SPIE 7271, pp. 72711C-1-72711C-12 (2009).

"Finite-difference time-domain method," Wikipedia, the free encyclopedia, http://en.wikipedia.org/wiki/Finite-difference_time-domain_method, pp. 1-14 (Dec. 14, 2010).

M. G. Moharam et al., "Rigorous coupled-wave analysis of planar-grating diffraction," J. Opt. Soc. Am., vol. 71, No. 7, pp. 811-818 (Jul. 1981), Andreas Erdmann et al., "Mask and Wafer Topography Effects in Immersion Lithography," Proc. of SPIE, vol. 5754, pp. 383-394 (2005).

Andreas Erdmann et al., "Validity of the Hopkins approximation in simulations of hyper NA (NA>1) line-space structures for an attenuated PSM mask," Proc. of SPIE vol. 6154, pp, 61540G-1-61540G-8 (2006).

\* cited by examiner

LITHOGRAPHY MODEL FOR THREE-DIMENSIONAL PATTERNING DEVICE

CROSS-REFERENCE TO RELATED APPLICATIONS

This application is the U.S. national phase entry of PCT patent application no. PCT/EP2014/052109, which was filed on Feb. 4, 2014, which claims the benefit of priority of U.S. provisional application no. 61/768,228, which was filed on Feb. 22, 2013, and which is incorporated herein in its entirety by reference.

BACKGROUND

A lithographic projection apparatus can be used, for example, in the manufacture of integrated circuits (ICs). In such a case, a patterning device (e.g., a mask) may contain or provide a circuit pattern corresponding to at least a part of an individual layer of the IC ("design layout"), and this circuit pattern can be transferred onto a target portion (e.g. comprising one or more dies) on a substrate (e.g., silicon wafer) that has been coated with a layer of radiation-sensitive material ("resist"), by methods such as irradiating the target portion through the circuit pattern on the patterning device. In general, a single substrate contains a plurality of adjacent target portions to which the circuit pattern is transferred successively by the lithographic projection apparatus, one target portion at a time. In one type of lithographic projection apparatuses, the circuit pattern on the entire patterning device is transferred onto one target portion in one go; such an apparatus is commonly referred to as a wafer stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the circuit pattern on the patterning device are transferred to one target portion progressively. Since, in general, the lithographic projection apparatus will have a magnification factor M (generally <1), the speed F at which the substrate is moved will be a factor M times that at which the projection beam scans the patterning device. More information with regard to lithographic devices as described herein can be gleaned, for example, from U.S. Pat. No. 6,046,792, incorporated herein by reference.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

As noted, microlithography is a central step in the manufacturing of ICs, where patterns formed on substrates define functional elements of the ICs, such as microprocessors, memory chips etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-$k_1$ lithography, according to the resolution formula $CD=k_1 \times \lambda/NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a circuit designer in order to achieve particular electrical functionality and performance. To overcome these difficulties, sophisticated fine-tuning steps are applied to the lithographic projection apparatus and/or design layout. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

BRIEF SUMMARY

As an example, OPC addresses the fact that the final size and placement of an image of the design layout projected on the substrate will not be identical to, or simply depend only on the size and placement of the design layout on the patterning device. It is noted that the terms "mask", "reticle", "patterning device" are utilized interchangeably herein. Furthermore, masks and reticles can be broadly termed "patterning devices." Also, person skilled in the art will recognize that, especially in the context of lithography simulation/optimization, the term "mask"/"patterning device" and "design layout" can be used interchangeably, as in lithography simulation/optimization, a physical patterning device is not necessarily used but a design layout can be used to represent a physical patterning device. For the small feature sizes and high feature densities present on some design layout, the position of a particular edge of a given feature will be influenced to a certain extent by the presence or absence of other adjacent features. These proximity effects arise from minute amounts of radiation coupled from one feature to another and/or non-geometrical optical effects such as diffraction and interference. Similarly, proximity effects may arise from diffusion and other chemical effects during post-exposure bake (PEB), resist development, and etching that generally follow lithography.

In order to ensure that the projected image of the design layout is in accordance with requirements of a given target circuit design, proximity effects need to be predicted and compensated for, using sophisticated numerical models, corrections or pre-distortions of the design layout. The article "Full-Chip Lithography Simulation and Design Analysis—How OPC Is Changing IC Design", C. Spence, Proc. SPIE, Vol. 5751, pp 1-14 (2005) provides an overview of current "model-based" optical proximity correction processes. In a typical high-end design almost every feature of the design layout has some modification in order to achieve high fidelity of the projected image to the target design. These modifications may include shifting or biasing of edge positions or line widths as well as application of "assist" features that are intended to assist projection of other features.

Application of model-based OPC to a target design involves good process models and considerable computational resources, given the many millions of features typically present in a chip design. However, applying OPC is generally not an "exact science", but an empirical, iterative process that does not always compensate for all possible proximity effect. Therefore, effect of OPC, e.g., design layouts after application of OPC and any other RET, need to be verified by design inspection, i.e. intensive full-chip simulation using calibrated numerical process models, in order to minimize the possibility of design flaws being built into the patterning device pattern. This is driven by the enormous cost of making high-end patterning devices, which run in the multi-million dollar range, as well as by the impact on turn-around time by reworking or repairing actual patterning devices once they have been manufactured.

Both OPC and full-chip RET verification may be based on numerical modeling systems and methods as described, for example in, U.S. patent application Ser. No. 10/815,573 and an article titled "Optimized Hardware and Software For Fast, Full Chip Simulation", by Y. Cao et al., Proc. SPIE, Vol. 5754, 405 (2005).

One RET is related to adjustment of the global bias of the design layout. The global bias is the difference between the patterns in the design layout and the patterns intended to print on the substrate. For example, a circular pattern of 25 nm diameter may be printed on the substrate by a 50 nm diameter pattern in the design layout or by a 20 nm diameter pattern in the design layout but with high dose.

In addition to optimization to design layouts or patterning devices (e.g., OPC), the illumination source can also be optimized, either jointly with patterning device optimization or separately, in an effort to improve the overall lithography fidelity. The terms "illumination source" and "source" are used interchangeably in this document. Since the 1990s, many off-axis illumination sources, such as annular, quadrupole, and dipole, have been introduced, and have provided more freedom for OPC design, thereby improving the imaging results, As is known, off-axis illumination is a proven way to resolve fine structures (i.e., target features) contained in the patterning device. However, when compared to a traditional illumination source, an off-axis illumination source usually provides less radiation intensity for the aerial image (AI). Thus, it becomes desirable to attempt to optimize the illumination source to achieve the optimal balance between finer resolution and reduced radiation intensity.

Numerous illumination source optimization approaches can be found, for example, in an article by Rosenbluth et al., titled "Optimum Mask and Source Patterns to Print A Given Shape", Journal of Microlithography, Microfabrication, Microsystems 1(1), pp. 13-20, (2002). The source is partitioned into several regions, each of which corresponds to a certain region of the pupil spectrum. Then, the source distribution is assumed to be uniform in each source region and the brightness of each region is optimized for process window. However, such an assumption that the source distribution is uniform in each source region is not always valid, and as a result the effectiveness of this approach suffers. In another example set forth in an article by Granik, titled "Source Optimization for Image Fidelity and Throughput", Journal of Microlithography, Microfabrication, Microsystems 3(4), pp. 509-522, (2004), several existing source optimization approaches are overviewed and a method based on illuminator pixels is proposed that converts the source optimization problem into a series of non-negative least square optimizations. Though these methods have demonstrated some successes, they typically require multiple complicated iterations to converge. In addition, it may be difficult to determine the appropriate/optimal values for some extra parameters, such as γ in Granik' s method, which dictates the trade-off between optimizing the source for substrate image fidelity and the smoothness requirement of the source.

For low $k_1$ photolithography, optimization of both the source and patterning device is useful to ensure a viable process window for projection of critical circuit patterns. Some algorithms (e.g. Socha et. al. Proc. SPIE vol. 5853, 2005, p. 180) discretize illumination into independent source points and mask into diffraction orders in the spatial frequency domain, and separately formulate a cost function (which is defined as a function of selected design variables) based on process window metrics such as exposure latitude which could be predicted by optical imaging models from source point intensities and patterning device diffraction orders. The term "design variables" as used herein comprises a set of parameters of a lithographic projection apparatus, for example, parameters a user of the lithographic projection apparatus can adjust. It should be appreciated that any characteristics of a lithographic projection process, including those of the source, the patterning device, the projection optics, and/or resist characteristics can be among the design variables in the optimization. The cost function is often a non-linear function of the design variables. Then standard optimization techniques are used to minimize the cost function.

Relatedly, the pressure of ever decreasing design rules have driven semiconductor chipmakers to move deeper into the low $k_1$ lithography era with existing 193 nm ArF lithography. Lithography towards lower $k_1$ puts heavy demands on RET, exposure tools, and the need for litho-friendly design.

1.35 ArF hyper numerical aperture (NA) exposure tools may be used in the future. To help ensure that circuit design can be produced on to the substrate with workable process window, source-patterning device optimization (referred to herein as source-mask optimization or SMO) is becoming a significant RET for 2× nm node.

A source and patterning device optimization method and system that allows for simultaneous optimization of the source and patterning device using a cost function without constraints and within a practicable amount of time is described in a commonly assigned International Patent Application No. PCT/US2009/065359, filed on November 20, 2009, and published as WO2010/059954, titled "Fast Freeform Source and Mask Co-Optimization Method", which is hereby incorporated by reference in its entirety.

Another source and mask optimization method and system that involves optimizing the source by adjusting pixels of the source is described in a commonly assigned U.S. patent application Ser. No. 12/813456, filed on Jun. 10, 2010, and published as U.S. Patent Application Publication No. 2010/0315614, titled "Source-Mask Optimization in Lithographic Apparatus", which is hereby incorporated by reference in its entirety.

Disclosed herein is a computer-implemented method for simulating a scattered radiation field of a patterning device comprising one or more features, in a lithographic projection apparatus, the method comprising: determining a scattering function of the patterning device using one or more scattering functions of feature elements of the one or more features; wherein at least one of the one or more features is a three-dimensional feature, or the one or more scattering functions characterize scattering of incident radiation fields at a plurality of incident angles on the feature elements.

According to an embodiment, the scattered radiation field is produced by an oblique incident radiation field scattered by the patterning device.

According to an embodiment, the feature elements are selected from a group consisting of edges, areas, corners, corners-in-proximity, edges-in-proximity and a combination thereof.

According to an embodiment, the one or more scattering functions are computed using a rigorous solver.

According to an embodiment, the one or more scattering functions characterize effects selected from a group consisting of shadowing effect, pattern-dependent best focus shift, pattern shift and a combination thereof.

According to an embodiment, the shadowing effect is asymmetric.

According to an embodiment, the pattern shift comprises global pattern shift and pattern-dependent pattern shift.

According to an embodiment, the pattern shift is caused by mask defocus.

According to an embodiment, the pattern shift is caused by that an incident radiation field at different locations on the patterning device has different incident angles.

According to an embodiment, the one or more scattering functions characterize secondary scattering among the one or more features.

According to an embodiment, the scattered radiation field comprises radiation with a wavelength in the extreme ultraviolet band.

According to an embodiment, the one or more scattering functions are compiled in a library.

According to an embodiment, the library comprise index information.

According to an embodiment, the one or more scattering functions characterize scattering of incident radiation fields at a plurality of incident angles on the feature elements.

According to an embodiment, the scattering function of the patterning device is calculated by summing products or convolutions of the one or more scattering functions of the feature elements and one of more filter functions depend on locations of the feature elements on the patterning device.

According to an embodiment, the method further comprises calculating the scattered radiation field from the scattering function of the patterning device and an incident radiation field.

According to an embodiment, the method further comprises calculating a radiation field in a resist layer on a wafer being exposed in the lithographic projection apparatus.

According to an embodiment, the method further comprises calculating a resist image.

According to an embodiment, the method further comprises selecting a plane on an optical path of the lithographic projection apparatus between the patterning device and projection optics, as an object plane of the projection optics, such that global pattern shift is essentially zero.

According to an embodiment, the one of more filter functions are functions of slit locations of a source in the lithographic projection apparatus.

Also described herein is a computer program product comprising a computer readable medium having instructions recorded thereon, the instructions when executed by a computer implementing the method of any of the above claims.

DETAILED DESCRIPTION

Figure 1:
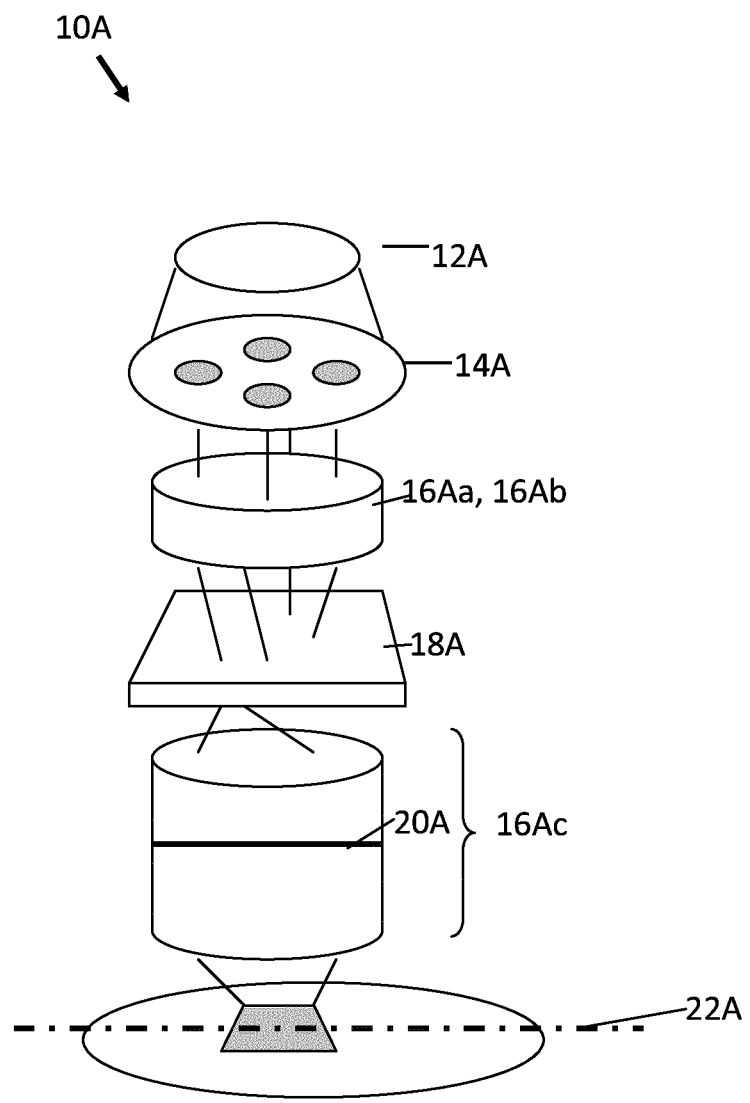
FIG. 1 is a block diagram of various subsystems of a lithography system.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term "optimizing" and "optimization" as used herein mean adjusting a lithographic projection apparatus such that results and/or processes of lithography have more desirable characteristics, such as higher accuracy of projection of design layouts on a substrate, larger process windows, etc.

Further, the lithographic projection apparatus may be of a type having two or more substrate tables (and/or two or more patterning device tables). In such "multiple stage" devices the additional tables may be used in parallel, or preparatory steps may be carried out on one or more tables while one or more other tables are being used for exposures. Twin stage lithographic projection apparatuses are described, for example, in U.S. Pat. No. 5,969,441, incorporated herein by reference.

The patterning device referred to above comprises or can form design layouts. The design layouts can be generated utilizing CAD (computer-aided design) programs, this process often being referred to as EDA (electronic design automation). Most CAD programs follow a set of predetermined design rules in order to create functional design layouts/patterning devices. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the substrate (via the patterning device).

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

a programmable minor array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means. More information on such minor arrays can be gleaned, for example, from U.S. Pat. Nos. 5,296,891 and 5,523,193, which are incorporated herein by reference.

a programmable LCD array. An example of such a construction is given in U.S. Pat. No. 5,229,872, which is incorporated herein by reference.

As a brief introduction, FIG. 1 illustrates an exemplary lithographic projection apparatus 10A. Major components are a radiation source 12A, which may be a deep-ultraviolet excimer laser source or other type of source including an extreme ultra violet (EUV) source (as discussed above, the lithographic projection apparatus itself need not have the radiation source), illumination optics which define the partial coherence (denoted as sigma) and which may include optics 14A, 16Aa and 16Ab that shape radiation from the source 12A; a patterning device 18A; and transmission optics 16Ac that project an image of the patterning device pattern onto a substrate plane 22A. An adjustable filter or aperture 20A at the pupil plane of the projection optics may restrict the range of beam angles that impinge on the substrate plane 22A, where the largest possible angle defines the numerical aperture of the projection optics NA=sin $(\Theta_{max})$.

In an optimization process of a system, a figure of merit of the system can be represented as a cost function. The optimization process boils down to a process of finding a set of parameters (design variables) of the system that minimizes the cost function. The cost function can have any suitable form depending on the goal of the optimization. For example, the cost function can be weighted root mean square (RMS) of deviations of certain characteristics (evaluation points) of the system with respect to the intended values (e.g., ideal values) of these characteristics; the cost function can also be the maximum of these deviations (i.e., worst deviation). The term "evaluation points" herein should be interpreted broadly to include any characteristics of the system. The design variables of the system can be confined to finite ranges and/or be interdependent due to practicalities of implementations of the system. In case of a lithographic projection apparatus, the constraints are often associated with physical properties and characteristics of the hardware such as tunable ranges, and/or patterning device manufacturability design rules, and the evaluation points can include physical points on a resist image on a substrate, as well as non-physical characteristics such as dose and focus.

In a lithographic projection apparatus, a source provides illumination (i.e. light); projection optics direct and shapes the illumination via a patterning device and onto a substrate. The term "projection optics" is broadly defined here to include any optical component that may alter the wavefront of the radiation beam. For example, projection optics may include at least some of the components 14A, 16Aa, 16Ab and 16Ac. An aerial image (AI) is the radiation intensity distribution at substrate level. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image, an example of which can be found in commonly assigned U.S. patent application Ser. No. 12/315,849, disclosure of which is hereby incorporated by reference in its entirety. The resist model is related only to properties of the resist layer (e.g., effects of chemical processes which occur during exposure, PEB and development). Optical properties of the lithographic projection apparatus (e.g., properties of the source, the patterning device and the projection optics) dictate the aerial image. Since the patterning device used in the lithographic projection apparatus can be changed, it is desirable to separate the optical properties of the patterning device from the optical properties of the rest of the lithographic projection apparatus including at least the source and the projection optics.

Figure 2:
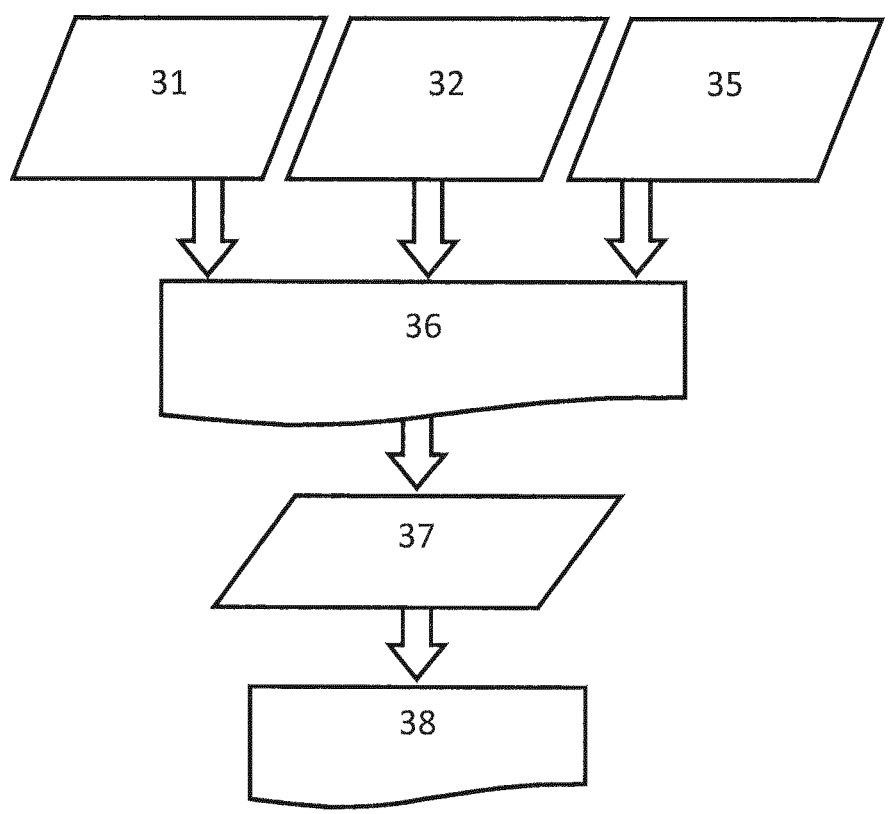
FIG. 2 is a block diagram of simulation models corresponding to the subsystems in FIG. 1.

An exemplary flow chart for simulating lithography in a lithographic projection apparatus is illustrated in FIG. 2. A source model 31 represents optical characteristics (including radiation intensity distribution and/or phase distribution) of the source. A projection optics model 32 represents optical characteristics (including changes to the radiation intensity distribution and/or the phase distribution caused by the projection optics) of the projection optics. A design layout model 35 represents optical characteristics (including changes to the radiation intensity distribution and/or the phase distribution caused by a given design layout 33) of a design layout, which is the representation of an arrangement of features on or formed by a patterning device. An aerial image 36 can be simulated from the design layout model 35, the projection optics model 32 and the design layout model 35. A resist image 37 can be simulated from the aerial image 36 using a resist model 37. Simulation of lithography can, for example, predict contours and CDs in the resist image 38.

More specifically, it is noted that the source model 31 can represent the optical characteristics of the source that include, but not limited to, NA-sigma (σ) settings as well as any particular illumination source shape (e.g. off-axis radiation sources such as annular, quadrupole, and dipole, etc.). The projection optics model 32 can represent the optical characteristics of the of the projection optics that include aberration, distortion, refractive indexes, physical sizes, physical dimensions, etc. The design layout model 35 can also represent physical properties of a physical patterning device, as described, for example, in U.S. Pat. No. 7,587,704, which is incorporated by reference in its entirety. The objective of the simulation is to accurately predict, for example, edge placements, aerial image intensity slopes and CDs, which can then be compared against an intended design. The intended design is generally defined as a pre-OPC design layout which can be provided in a standardized digital file format such as GDSII or OASIS or other file format.

From this design layout, one or more portions may be identified, which are referred to as "clips". In an embodiment, a set of clips is extracted, which represents the complicated patterns in the design layout (typically about 50 to 1000 clips, although any number of clips may be used). As will be appreciated by those skilled in the art, these patterns or clips represent small portions (i.e. circuits, cells or patterns) of the design and especially the clips represent small portions for which particular attention and/or verification is needed. In other words, clips may be the portions of the design layout or may be similar or have a similar behavior of portions of the design layout where critical features are identified either by experience (including clips provided by a customer), by trial and error, or by running a full-chip simulation. Clips usually contain one or more test patterns or gauge patterns.

An initial larger set of clips may be provided a priori by a customer based on known critical feature areas in a design layout which require particular image optimization. Alternatively, in another embodiment, the initial larger set of clips may be extracted from the entire design layout by using some kind of automated (such as, machine vision) or manual algorithm that identifies the critical feature areas.

Figure 3:
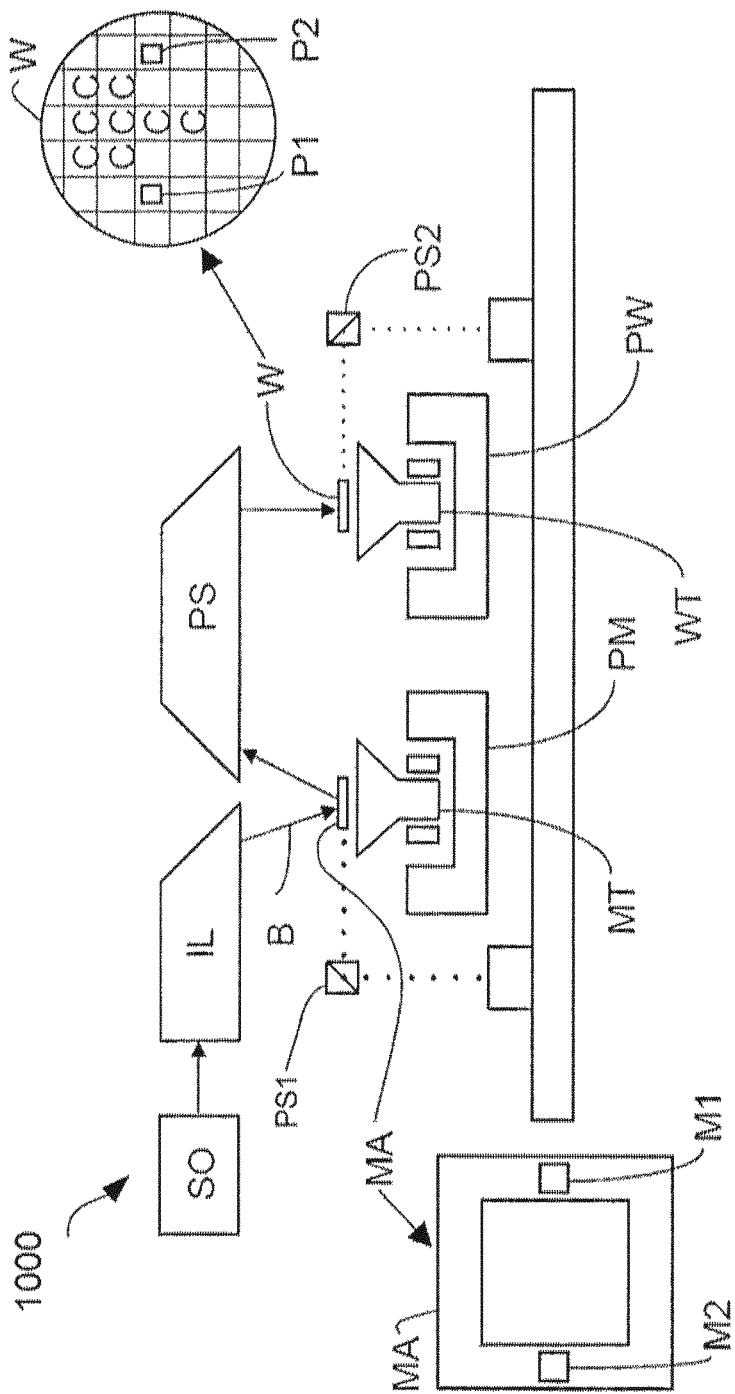
FIG. 3 is a schematic diagram of a lithographic projection apparatus.

FIG. 3 schematically depicts an exemplary lithographic projection apparatus. The apparatus comprises:
- an illumination system IL, to condition a beam B of radiation. In this particular case, the illumination system also comprises a radiation source SO;
- a first object table (e.g., mask table) MT provided with a patterning device holder to hold a patterning device MA (e.g., a reticle), and connected to a first positioner to accurately position the patterning device with respect to item PS;
- a second object table (substrate table) WT provided with a substrate holder to hold a substrate W (e.g., a resist-coated silicon wafer), and connected to a second positioner to accurately position the substrate with respect to item PS;
- a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning device as an alternative to the use of a classic mask; examples include a programmable minor array or LCD matrix.

The source SO (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 3 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing minors); this latter scenario is often the case when the source SO is an excimer laser (e.g., based on KrF, ArF or $F_2$ lasing).

The beam PB subsequently intercepts the patterning device MA, which is held on a patterning device table MT. Having traversed the patterning device MA, the beam B passes through the lens PL, which focuses the beam B onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 3. However, in the case of a wafer stepper (as opposed to a step-and-scan tool) the patterning device table MT may just be connected to a short stroke actuator, or may be fixed.

The depicted tool can be used in two different modes:

In step mode, the patterning device table MT is kept essentially stationary, and an entire patterning device image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 4:
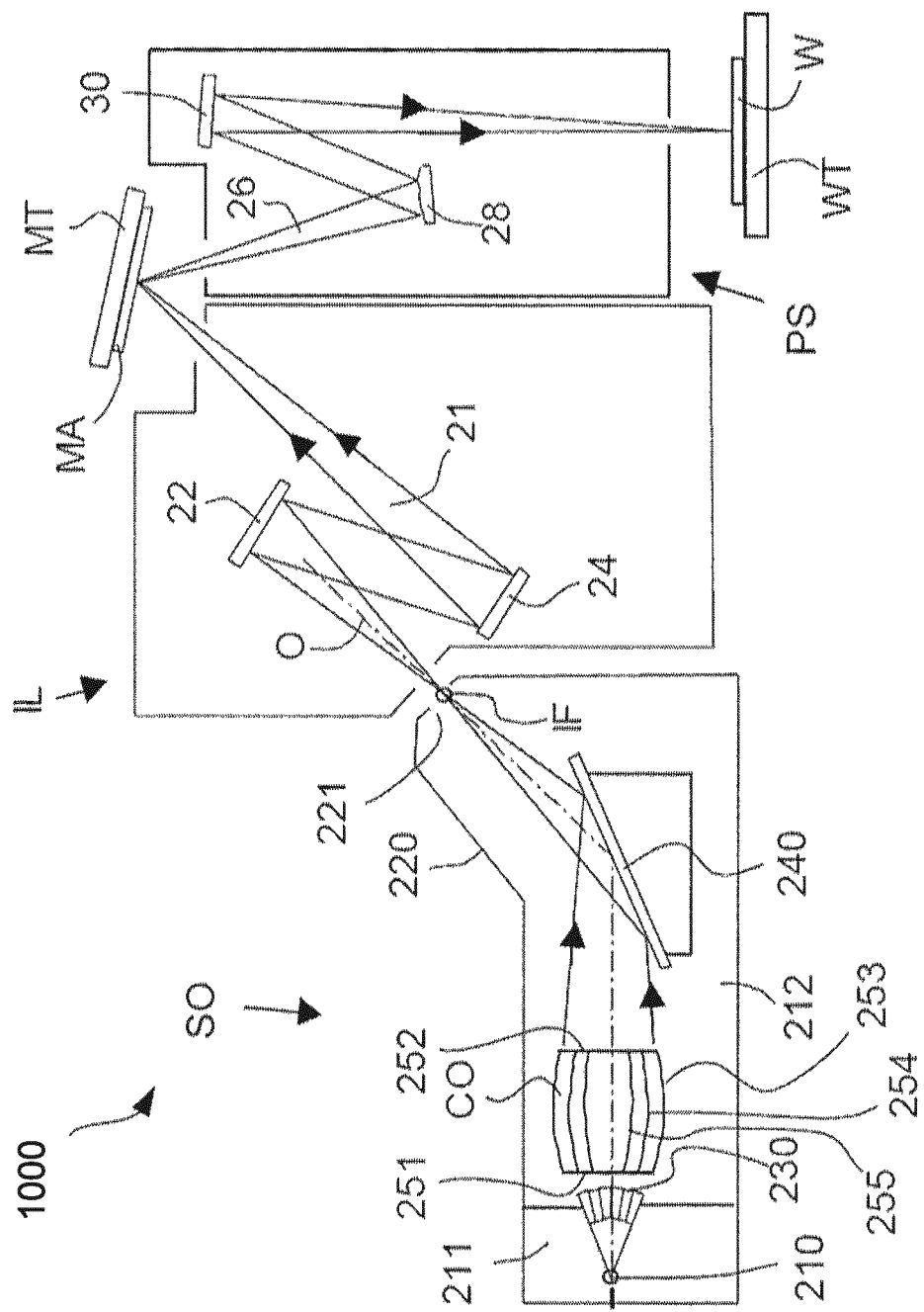
FIG. 4 is a more detailed view of the apparatus in FIG. 3.

FIG. 4 schematically depicts another exemplary lithographic projection apparatus 1000. The light used in this exemplary lithographic projection apparatus may be EUV.

The lithographic projection apparatus 1000 includes:

a source collector module SO an illumination system (illuminator) IL configured to condition a radiation beam B (e.g. EUV radiation).

a support structure (e.g. a mask table) MT constructed to support a patterning device (e.g. a mask or a reticle) MA and connected to a first positioner PM configured to accurately position the patterning device;

a substrate table (e.g. a wafer table) WT constructed to hold a substrate (e.g. a resist coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

As here depicted, the apparatus 1000 is of a reflective type (e.g. employing a reflective mask). It is to be noted that because most materials are absorptive within the EUV wavelength range, the mask may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 4, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 4, for providing the laser beam exciting the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil minor devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 1000 could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable minor array of a type as referred to above.

Figure 14:
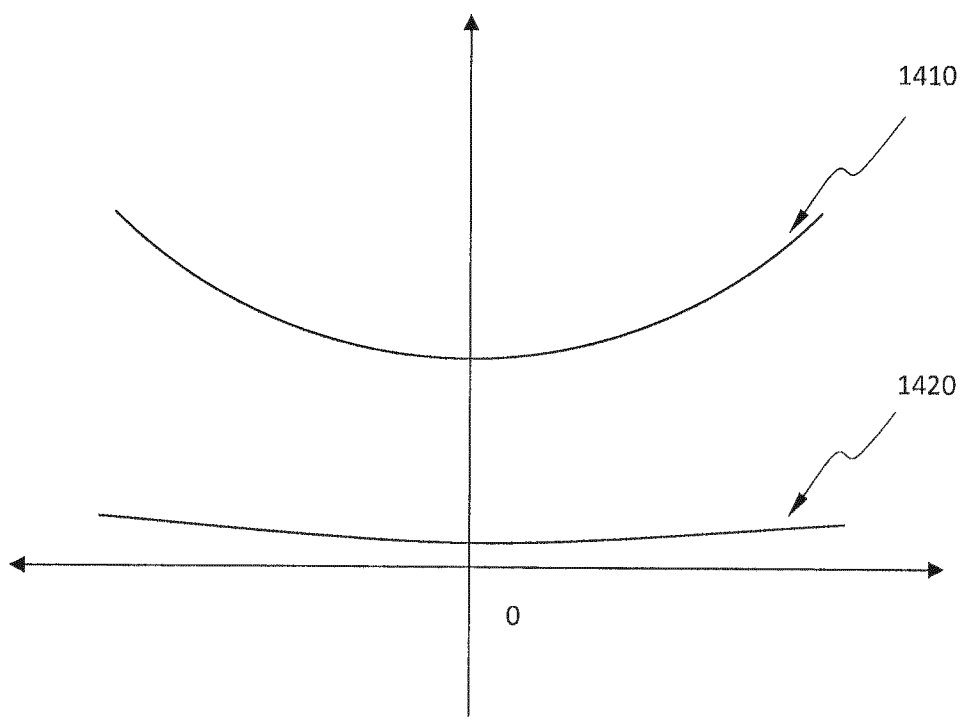
FIG. 14 shows an exemplary comparison of the method shown in FIG. 11 with a "thin mark" model.

FIG. 14 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field minor device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 4.

Collector optic CO, as illustrated in FIG. 4, is depicted as a nested collector with grazing incidence reflectors 253, 254 and 255, just as an example of a collector (or collector minor). The grazing incidence reflectors 253, 254 and 255 are disposed axially symmetric around the optical axis O and a collector optic CO of this type is preferably used in combination with a discharge produced plasma source, often called a DPP source.

Figure 5:
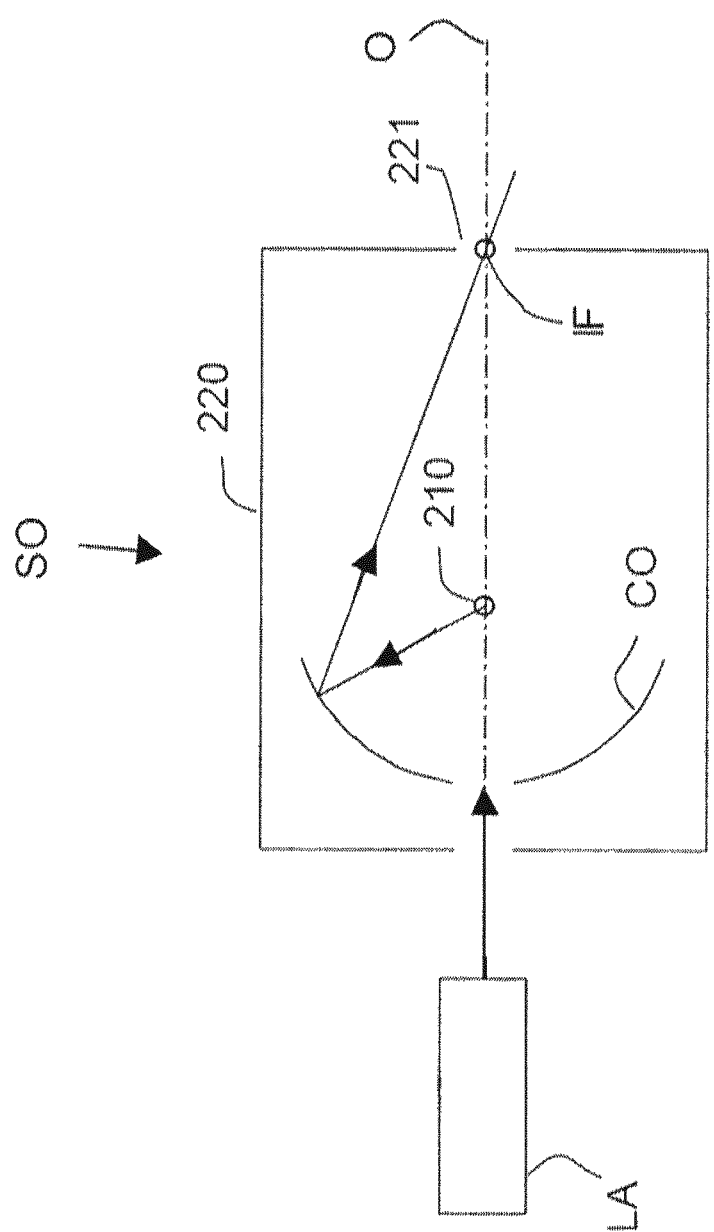
FIG. 5 is a more detailed view of the source collector module SO of the apparatus of FIGS. 3 and 4.

Alternatively, the source collector module SO may be part of an LPP radiation system as shown in FIG. 5. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

A patterning device used in a lithographic projection apparatus using EUV for exposure, such as the one shown in FIGS. 3-5 may be arranged such that light from the source is oblique relative to the surface of the patterning device. For example, the radiation field 21 is incident at an oblique angle relative to the surface of the patterning device MA in FIG. 4. In contrast, in a lithographic projection apparatus using DUV for exposure, light from the source is generally normal to the surface of the patterning device.

Figure 6:
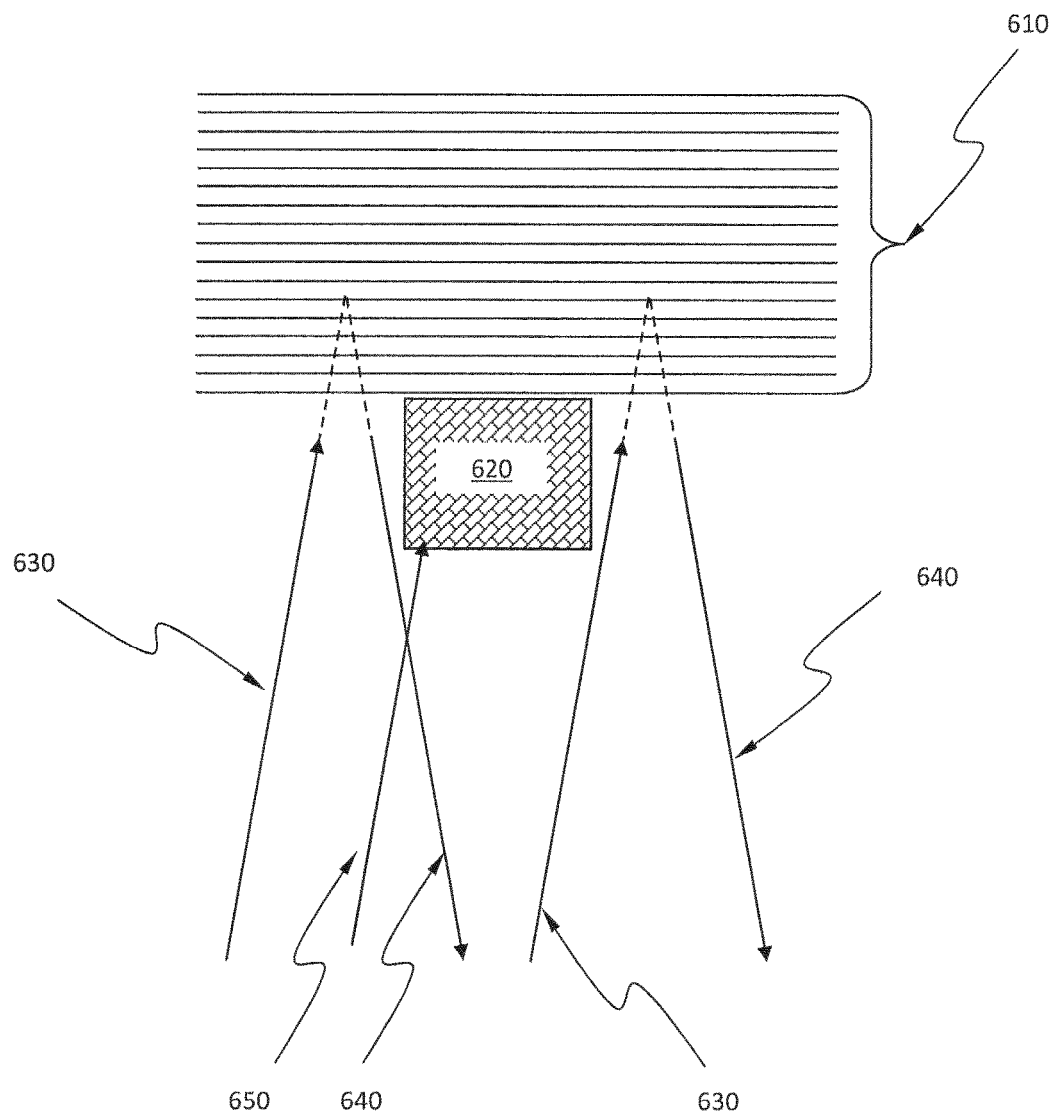
FIG. 6 shows a mask suitable for lithography using EUV for exposure.

A patterning device may include three-dimensional features. For example, as shown in FIG. 6, a mask suitable for lithography using EUV for exposure, may comprise a reflective layer 610 and patterns 620 on the reflective layer 610. The reflective layer 610 may be a multi-layer minor. As used herein, the term "patterns" on a patterning device is synonymous to the term "features" on a patterning device. The patterns 620 may be a material that absorbs essentially all incident EUV radiation field from the source and the patterns 620 are three-dimensional, i.e., protruding from the reflective layer 610 by a height at least comparable to the wavelength of the incident radiation. Incident radiation field 630 that hits the reflective layer 610 is scattered to the projection optics as scattered radiation field 640 while incident radiation field 650 that hit the patterns 620 is absorbed and is not scattered to the projection optics.

The oblique incident radiation field and the three-dimensional features, alone or in combination, may cause various effects in the lithographic projection process. The incident radiation field being "oblique" may mean a chief ray of the incident radiation field is not normal to a substrate of the patterning device.

Figure 7A:
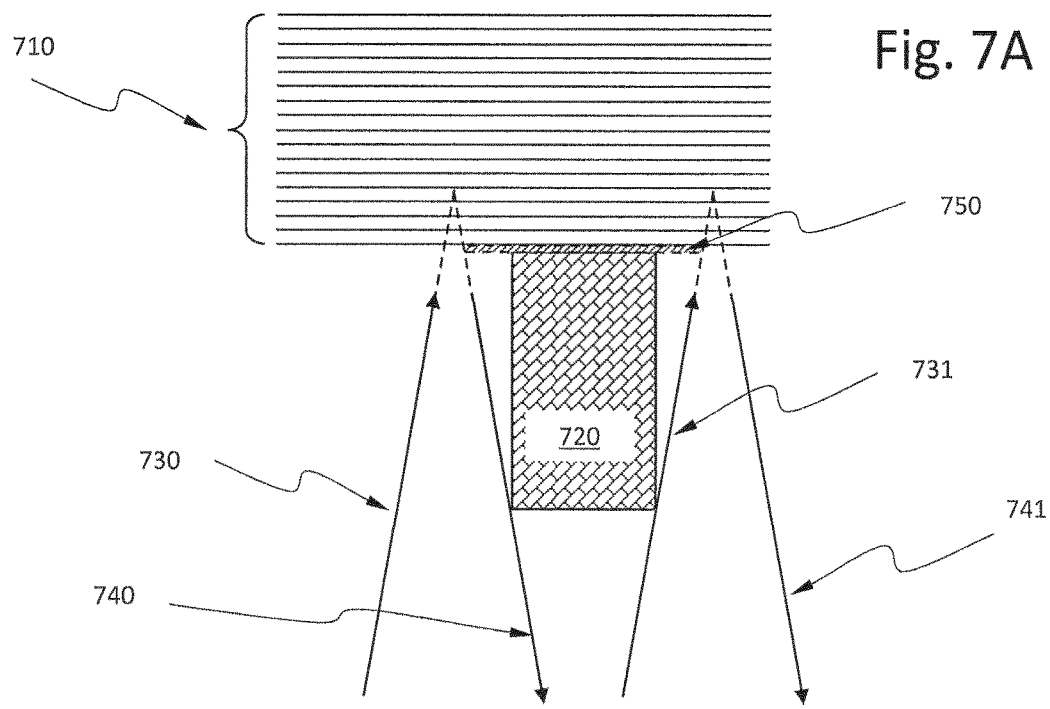
FIGS. 7A-7C shows the shadowing effect.
Figure 7B:
Figure 7C:
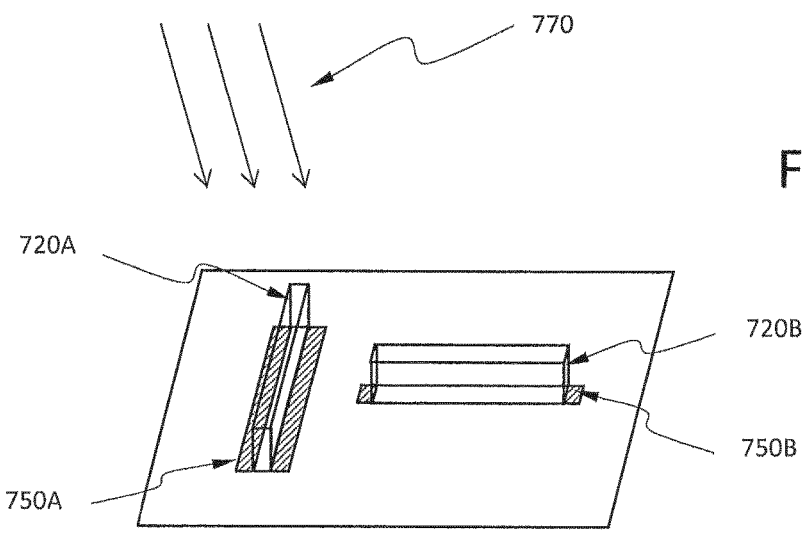

A first such effect is shadowing effect. As schematically illustrated in FIG. 7A, incident radiation fields 730 and 731 hit reflective layer 710 of a patterning device and are scattered as scattered radiation fields 740 and 741 toward the projection optics. The radiation fields 730, 731, 740 and 741 do not hit pattern 720. Because pattern 720 is a three-dimensional feature, any incident beams between radiation fields 730 and 731 would be blocked by pattern 720. Since the incident radiation fields are oblique and pattern 720 is three-dimensional, from the perspective of the projection optics, no scattered radiation fields would originate in a shadow area 750 more extensive than the footprint of pattern 720. FIG. 7B shows the top view of the pattern 720 and shadow area 750. Shadow area 750 may be asymmetric relative to pattern 720 because incident beams are asymmetric relative to the normal direction of the patterning device. FIG. 7C shows a perspective view of the shadowing effect. Incident radiation fields 770 are generally perpendicular to a bar-shaped three-dimensional pattern 720A and leave a shadow area 750A along the length-wise direction of pattern 720A. Incident radiation fields 770 are generally parallel to another bar-shaped three-dimensional pattern 720B and leave a shadow area 750B along the width-wise direction of pattern 720B.

Figure 8:
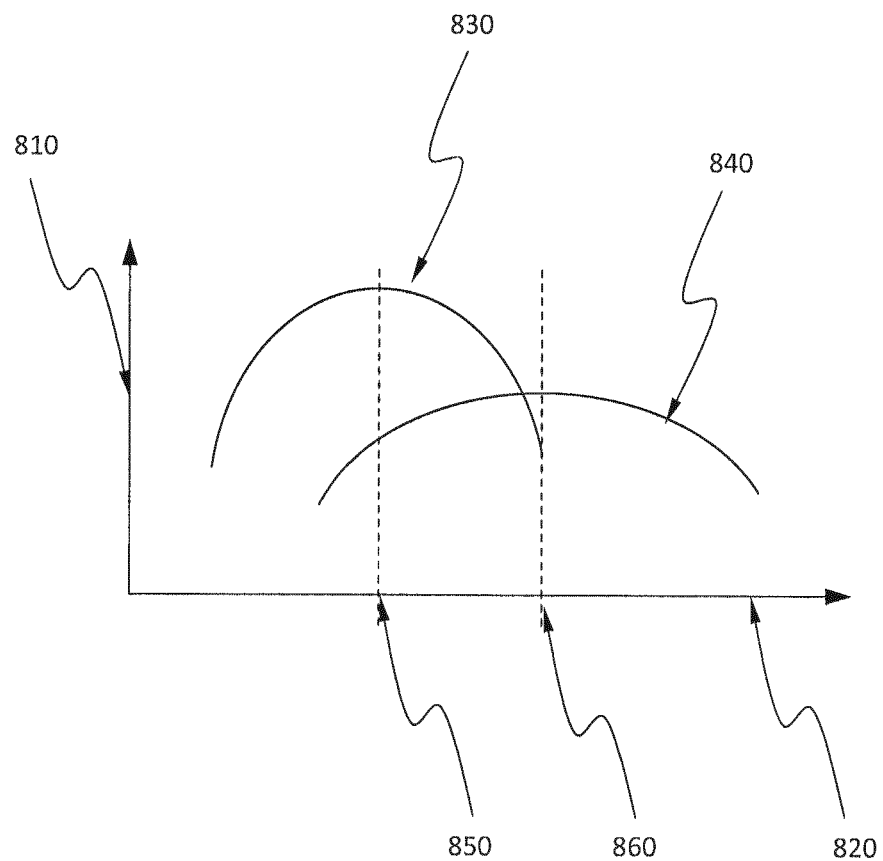
FIG. 8 shows the pattern-dependent best focus shift.

A second such effect is pattern-dependent best focus shift. Pattern-dependent best focus shift may be caused by pattern-dependent phase distortion in reflected beams from three-dimensional patterns on a patterning device. Namely, reflected beams from different three-dimensional patterns may have different phases and interference among the reflected beams may distort the reflected beams. As shown in FIG. 8, the vertical axis 810 is contrast and the horizontal axis 820 is focus. Two features on a patterning device have different relations 830 and 840 between contrast of their images and focus. The best focuses (i.e., focus that yield the highest contrast) 850 and 860 for these features are different.

Figure 9:
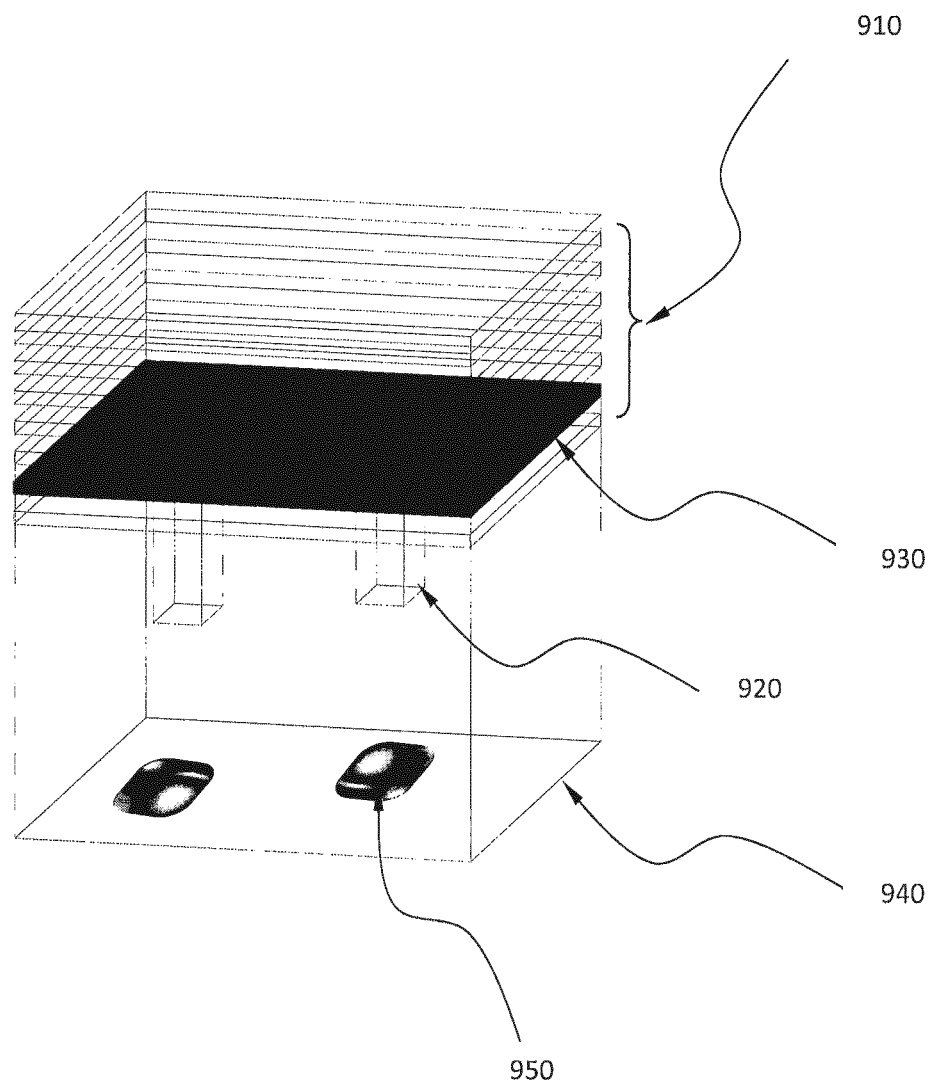
FIG. 9 shows mask defocus.

A third such effect is pattern shift. Pattern shift may include global pattern shift (all patterns shifting by essentially the same amount) and pattern-dependent pattern shift (not all patterns shifting by the same amount). One source of pattern shift is that the object plane of the projection optics may be different from the near-field sample plane chosen in lithography simulation in the method shown in FIG. 2. FIG. 9 illustrates the pattern shift from this source. The near-field sample plane 940 is usually chosen to be close to the top surface of the patterns 920 on the patterning device. The distance between the object plane 930 and the near-field sample plane 940 may be referred to as "mask defocus." 950 is the reflected field of patterns 920 on the near-field sample plane 940. 910 is the reflective layer of the patterning device. The pattern shift caused by mask defocus may be trivial in a lithographic projection apparatus using DUV if illumination on the patterning device is symmetric. Pattern shift caused by mask defocus may not be trivial in a lithographic projection apparatus using EUV because the patterning device is reflective and the incident beams are oblique, which lead to asymmetric illumination on the patterning device. Pattern shift caused by mask defocus is generally independent from the locations of the patterns on the patterning device.

Figure 10:
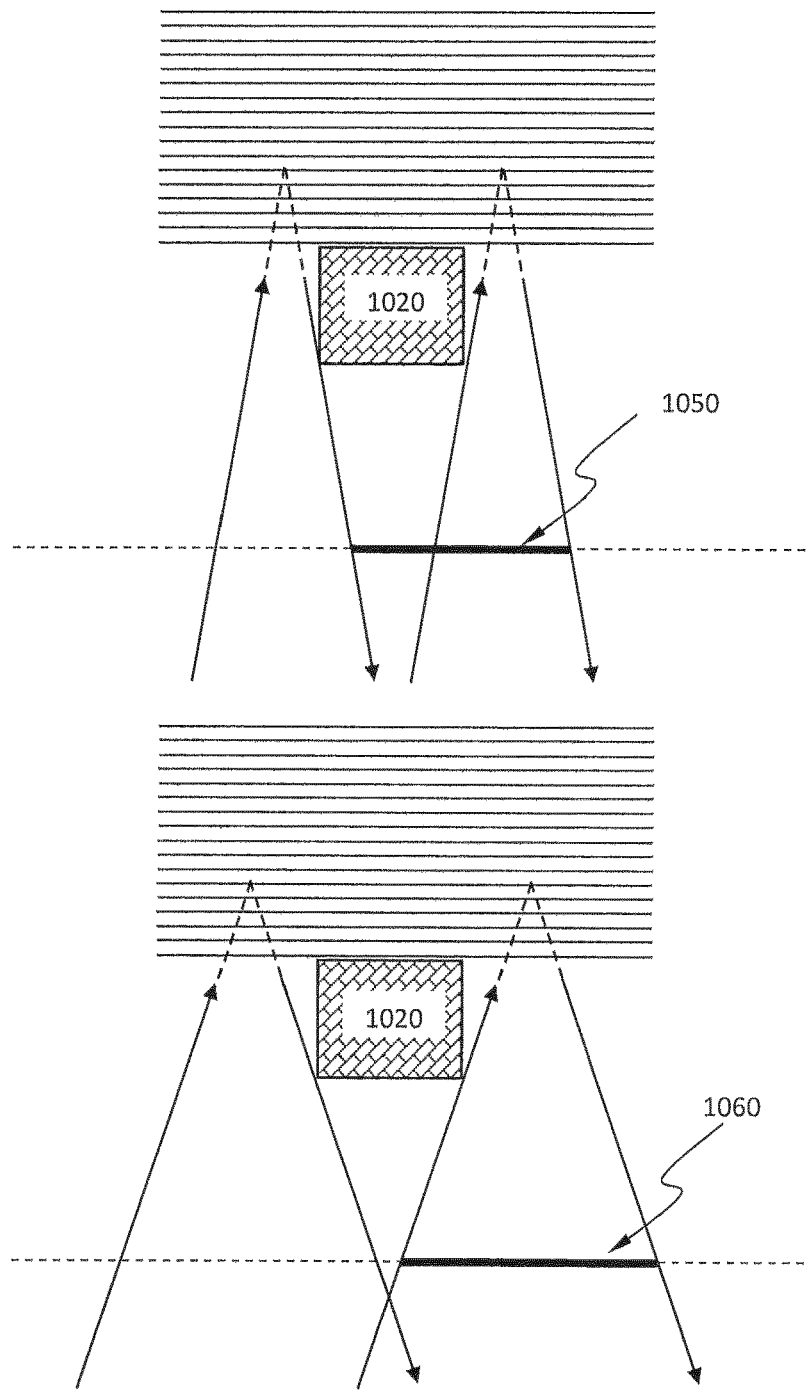
FIG. 10 shows pattern shift.

Another source of pattern shift is that the incident radiation field at different locations on the patterning device has different incident angles (for example, in the step mode of the apparatus shown in FIG. 4.) FIG. 10 schematically illustrates that incident beams at different incident angles produce images 1050 and 1060 at different locations of the same pattern 1020.

Figure 11:
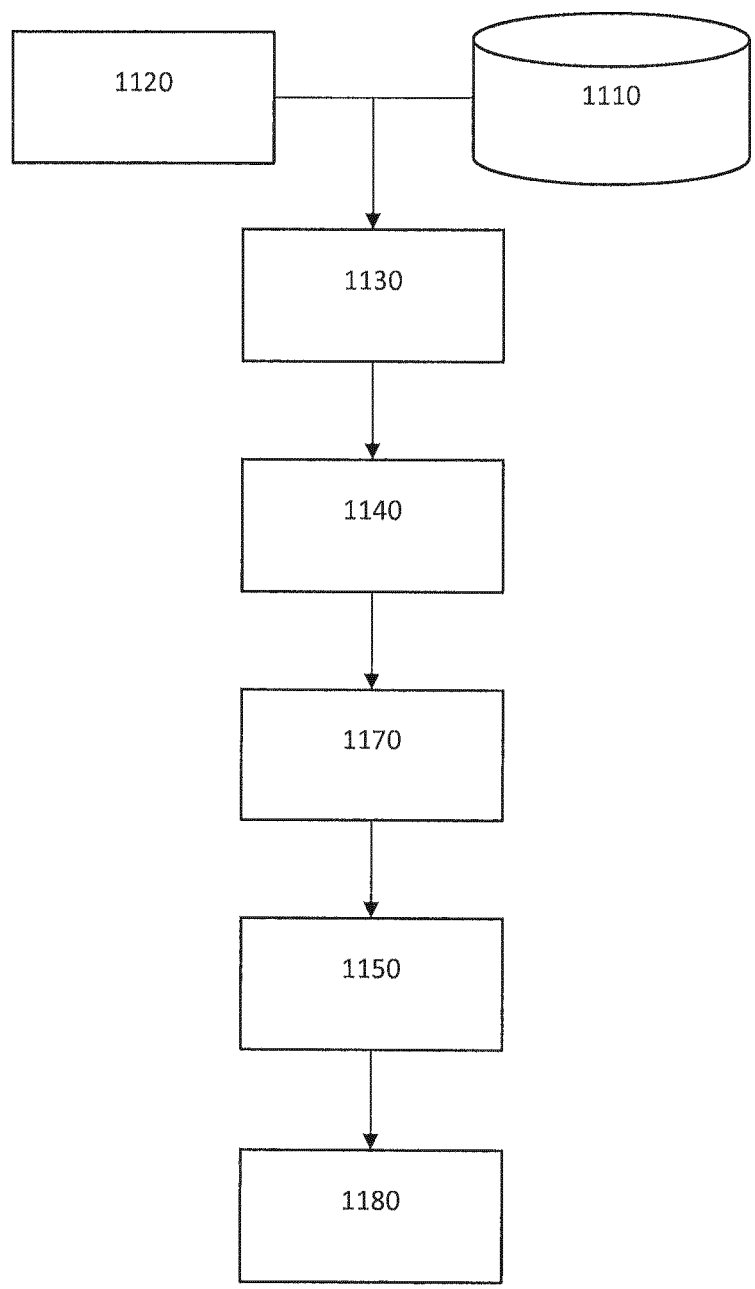
FIG. 11 shows a flow chart of a method according to an embodiment.

These effects may be included in simulation of the lithography, by methods such as that shown in FIG. 2. However, calculating these effects analytically (e.g., using Maxwell's equations) or numerically (using methods such as FDTD and Rigorous Coupled-Wave Analysis (RCWA)) may be too computationally costly to be practical. According to an embodiment, a less computationally costly method that can be applied to a substantially full circuit design or the full mask is illustrated in the flow chart in FIG. 11. These effects may be characterized in the scattering functions of the feature elements. A scattering function of the features 1120 on a patterning device can be estimated using a library 1110 of scattering functions of feature elements such as edges, corners and surfaces, wherein the scattering functions of the feature elements are previously calculated rigorously by a rigorous solver such as solving Maxwell's equations and compiled into the library. The word "library" as used herein means a plurality or a set, with or without any index to facilitate search therein. Alternatively, the scattering functions of feature elements such as edges, corners and surfaces can be rigorously calculated when they are first needed during the estimation of the scattering function of the features. The term "scattering function" of an object as used herein means a function that characterizes scattering of an incident radiation field by the object, namely a relationship between an incident radiation field on the object and a radiation field scattered by the object (referred to as "scattered radiation field"). With a given incident radiation field, the scattered radiation field of an object can be calculated using the scattering function of the object. The features 1120 can be broken down to their components of feature elements and the scattering function 1130 of the patterning device can be derived from the scattering functions of the components of feature elements, which are known from the library 1110 or calculated as needed. Applying the scattering function 1130 of the features 1120 to the incident radiation field (i.e., light from the source) (which can be characterized by an electrical field, magnetic field or electromagnetic field at a pupil plane of the source) produces a scattered radiation field 1140. Optionally, a plane 1170 on the optical path of the lithographic projection apparatus between patterning device and the projection optics is selected as the object plane of the projection optics such that the global pattern shift is essentially zero. A radiation field 1150 in a resist layer on a wafer can be calculated from the radiation field 1140. Optionally, a resist image 1180 can be derived from the radiation field 1150. The method in FIG. 11 is applicable when the patterning device comprises three-dimensional features. However, the method in FIG. 11 is also applicable when the patterning device only comprises two-dimensional features.

Figure 12:
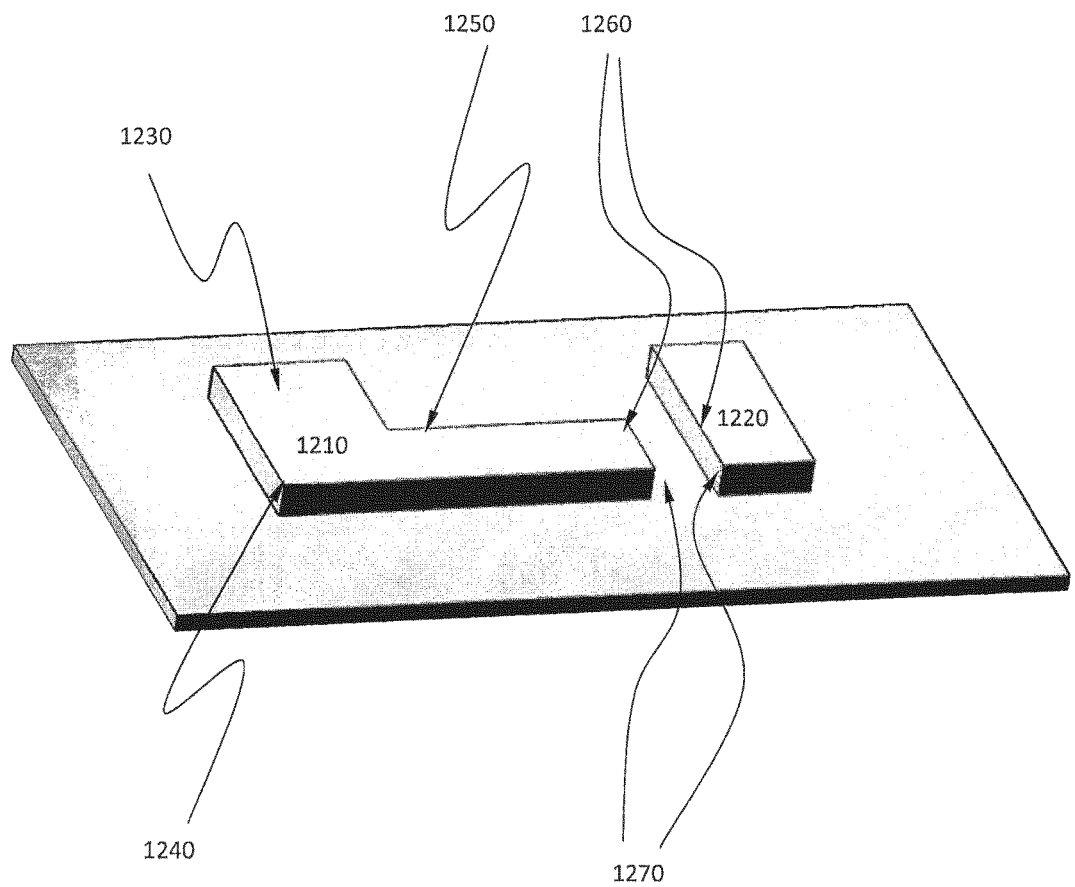
FIG. 12 schematically shows features on a patterning device.

As illustrated in FIG. 12, features such as 1210 and 1220 of a patterning device may scatter incident radiation from feature elements such as surfaces 1230, edges 1250, corners 1240, edges-in-proximity 1260, and corners-in-proximity 1270. "Edges-in-proximity" 1260 is a feature element comprising two edges of one or more features. "Corners-in-proximity" 1270 is a feature element comprising two corners of one or more features. The term "scatter" or "scattering" as used herein means a combination of effects to incident radiation, which can include reflection, diffraction, absorption and refraction. Scattered radiation can interfere with incident radiation and change spatial intensity distribution of radiation in the object plane of the projection optics, which in turn changes a resist image formed on the wafer.

Figure 13:
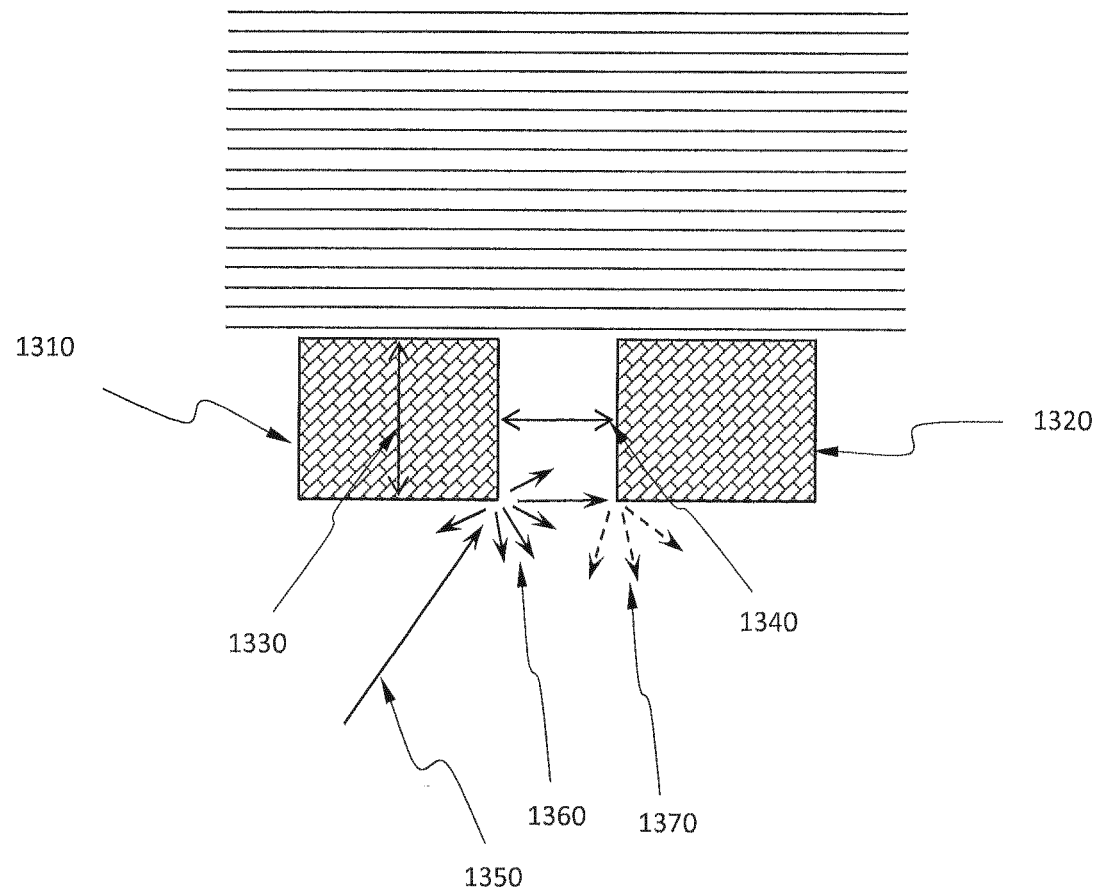
FIG. 13 illustrates the secondary scattering.

Secondary scattering of feature elements such as edges-in-proximity 1260 and corners-in-proximity 1270 may be calculated in the simulation. For example, as shown in FIG. 13, if two features 1310 and 1320 are tall (i.e., height 1330>>wavelength of the incident radiation 1350) and distance 1340 between features 1310 and 1320 is comparable to height 1330, secondary scattering may not be trivial. Primary scattering 1360 is the scattering of the incident radiation 1350 by feature 1310; secondary scattering 1370 is the scattering of the primary scattering 1360 by feature 1320. For example, secondary scattering of feature elements may be calculated when two edges are closer than three times of the height of the features.

In one embodiment, scattering functions of feature elements at a plurality of incident angles may be rigorously calculated by a suitable method such as solving Maxwell's equations and compiled into the library, or rigorously calculated when they are first needed during the estimation of the scattering function of the features.

In one embodiment, the plurality of incident angles include chief ray angles from a plurality of positions on the pupil of the source. In one embodiment, chief rays from the plurality of positions on the pupil of the source are incoherent.

In an embodiment, scattering function 1130 ($S(\vec{q})$ in the reciprocal space or $S(\vec{r})$ in the real space) of the features 1120 can be derived from the scattering functions of the components of feature elements, which are known from the library 1110 or calculated as needed, as follows:

$S(\vec{q}) = \Sigma o(\vec{q}) \cdot f(\vec{q})$ or $S(\vec{r}) = \Sigma O(\vec{r}) \otimes F(\vec{r})$, respectively, wherein $O(\vec{r})$ is a filter function of the feature elements, which characterizes the geometrical characteristics of the feature elements; $o(\vec{q})$ is Fourier transforms of $O(\vec{r})$. $F(\vec{r})$ is scattering functions of feature elements; $f(\vec{q})$ is Fourier transforms of $F(\vec{r})$; and $\otimes$ denotes convolution. $O(\vec{r})$ and $o(\vec{q})$ may be a function of the locations of the feature elements on the patterning device. In an embodiment, $O(\vec{r})$ and $o(\vec{q})$ may be functions of slit locations of the source in the lithographic projection apparatus.

FIG. 14 shows an exemplary comparison of the method shown in FIG. 11 with a "thin mark" model (i.e., no effect of three-dimensionality of the patterns considered). The horizontal axis is focus. The vertical axis is deviation of simulated CD from CD calculated by a rigorous method such as FDTD. The patterning device used in this comparison is a dark field patterning device and comprises horizontal bars. NA=0.33, under a dipole illumination. Thin mark model produces a much larger deviation 1410 than the deviation 1420 the method of FIG. 11 produces.

Figure 15:
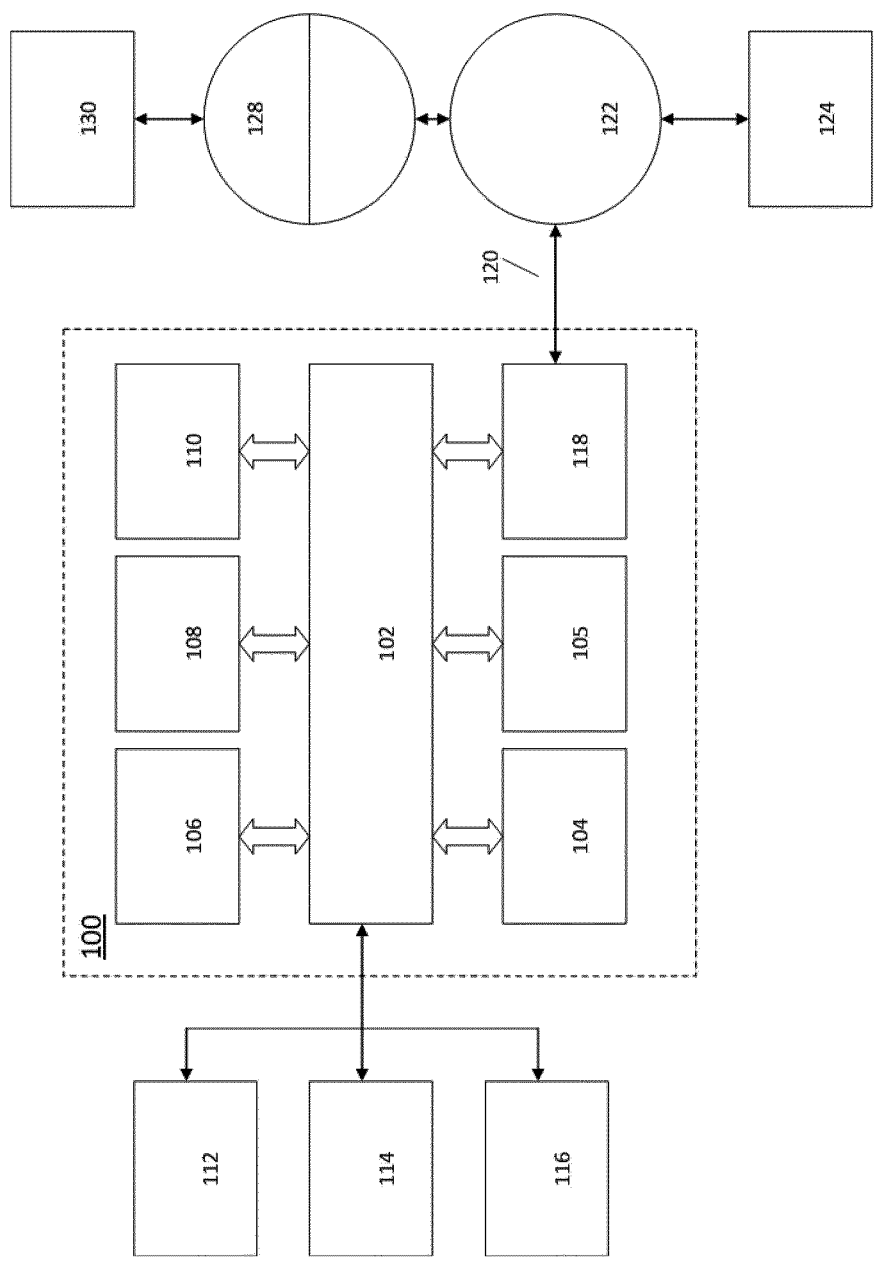
FIG. 15 is a block diagram of an example computer system.

FIG. 15 is an exemplary block diagram that illustrates a computer system 100 which can assist in embodying and/or implementing the pattern selection method disclosed herein. Computer system 100 includes a bus 102 or other communication mechanism for communicating information, and one or more processor(s) 104 (and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the simulation process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions. Thus, embodiments are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with an embodiment, one such downloaded application provides for the test pattern selection of the embodiment, for example. The received code may be executed by processor 104 as it is received, and/or stored in storage device 110, or other non-volatile storage for later execution. In this manner, computer system 100 may obtain application code in the form of a carrier wave.

Figure 16:
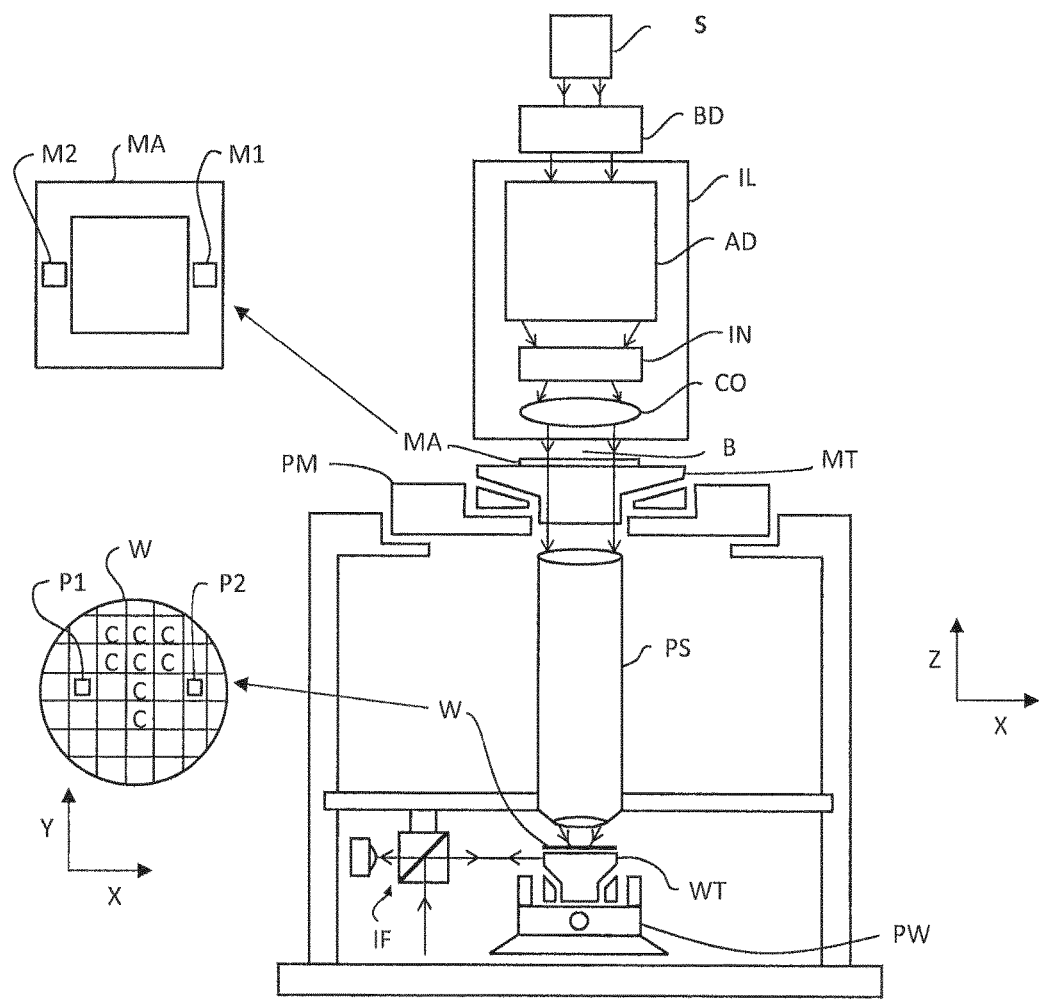
FIG. 16 a schematic diagram of another lithographic projection apparatus.

FIG. 16 schematically depicts an exemplary lithographic projection apparatus whose performance could be simulated and/or optimized utilizing the computational lithography models that are calibrated using the test pattern selection process of present invention. The apparatus comprises:
- a radiation system Ex, IL, for supplying a projection beam B of radiation. In this particular case, the radiation system also comprises a radiation source SO;
- a first object table (mask table) MT provided with a mask holder for holding a mask MA (e.g., a reticle), and connected to first positioning means PM for accurately positioning the mask with respect to projection system PS;
- a second object table (substrate table) WT provided with a substrate holder for holding a substrate W (e.g., a resist coated silicon wafer), and connected to second positioning means PW for accurately positioning the substrate with respect to projection system PS;
- a projection system ("lens") PS (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source SO (e.g., a mercury lamp or excimer laser) produces a beam of radiation. This beam is fed into an illumination system (illuminator) IL, either directly or after having traversed conditioning means, such as a beam expander or beam delivery system BD, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the mask MA has a desired uniformity and intensity distribution in its cross section.

It should be noted with regard to FIG. 16 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing minors); this latter scenario is often the case when the source SO is an excimer laser (e.g., based on KrF, ArF or F2 lasing). The current invention encompasses at least both of these scenarios.

The beam B subsequently intercepts the mask MA, which is held on a mask table MT. Having traversed the mask MA, the beam B passes through the lens PS, which focuses the beam PS onto a target portion C of the substrate W. With the aid of the second positioning means (and interferometric measuring means IF), the substrate table WT can be moved accurately, e.g. so as to position different target portions C in the path of the beam B. Similarly, the first positioning means can be used to accurately position the mask MA with respect to the path of the beam B, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 16. However, in the case of a wafer stepper (as opposed to a step-and-scan tool) the mask table MT may just be connected to a short stroke actuator, or may be fixed.

Patterning device MA and substrate W may be aligned using alignment marks M1, M2 in the patterning device, and alignment marks P1, P2 on the wafer, as required.

The depicted tool can be used in two different modes:
- In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam B;
- In scan mode, essentially the same scenario applies, except that a given target portion C is not exposed in a single "flash". Instead, the mask table MT is movable in a given direction (the so called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include DUV (deep ultra violet) lithography that is capable of producing a 193 nm wavelength with the use of a ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range. Because most materials are absorptive within this range, illumination may be produced by reflective minors with a multi-stack of Molybdenum and Silicon. The multi-stack minor has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Although the present invention has been particularly described with reference to the preferred embodiments thereof, it should be readily apparent to those of ordinary skill in the art that changes and modifications in the form and details may be made without departing from the spirit and scope. It is intended that the appended claims encompass such changes and modification. The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The invention may further be described using the following clauses:
1. A computer-implemented method for simulating a scattered radiation field of a patterning device comprising one or more features, in a lithographic projection apparatus, the method comprising:
determining a scattering function of the patterning device using one or more scattering functions of feature elements of the one or more features;
wherein at least one of the one or more features is a three-dimensional feature.
2. A computer-implemented method for simulating a scattered radiation field of a patterning device comprising one or more features, in a lithographic projection apparatus, the method comprising:
determining a scattering function of the patterning device using one or more scattering functions of feature elements of the one or more features;
wherein the one or more scattering functions characterize scattering of incident radiation fields at a plurality of incident angles on the feature elements.
3 The method of clause 1 or 2, wherein the scattered radiation field is produced by an oblique incident radiation field scattered by the patterning device.
4. The method clause 1 or 2, wherein the feature elements are selected from a group consisting of edges, areas, corners, corners-in-proximity, edges-in-proximity and a combination thereof.
5. The method of clause 1 or 2, wherein the one or more scattering functions are computed using a rigorous solver.
6. The method of clause 1 or 2, wherein the one or more scattering functions characterize effects selected from a group consisting of shadowing effect, pattern-dependent best focus shift, pattern shift and a combination thereof.
7. The method of clause 6, wherein the shadowing effect is asymmetric.
8. The method of clause 6, wherein the pattern shift comprises global pattern shift and pattern-dependent pattern shift.
9. The method of clause 6, wherein the pattern shift is caused by mask defocus.
10. The method of clause 6, wherein the pattern shift is caused by that an incident radiation field at different locations on the patterning device has different incident angles.
11. The method of clause 1 or 2, wherein the one or more scattering functions characterize secondary scattering among the one or more features.
12. The method of clause 1 or 2, wherein the scattered radiation field comprises radiation with a wavelength in the extreme ultraviolet band.
13. The method of clause 1 or 2, wherein the one or more scattering functions are compiled in a library.
14. The method of clause 13, wherein the library comprise index information.
15. The method of clause 1, wherein the one or more scattering functions characterize scattering of incident radiation fields at a plurality of incident angles on the feature elements.
16. The method of clause 1 or 2, wherein the scattering function of the patterning device is calculated by summing products or convolutions of the one or more scattering functions of the feature elements and one of more filter functions depend on locations of the feature elements on the patterning device.
17. The method of clause 1 or 2, further comprising calculating the scattered radiation field from the scattering function of the patterning device and an incident radiation field.
18. The method of clause 1 or 2, further comprising calculating a radiation field in a resist layer on a wafer being exposed in the lithographic projection apparatus.
19. The method of clause 1 or 2, further comprising calculating a resist image.
20. The method of clause 1 or 2, further comprising selecting a plane on an optical path of the lithographic projection apparatus between the patterning device and projection optics, as an object plane of the projection optics, such that global pattern shift is essentially zero.
21. The method of clause 16, wherein the one of more filter functions are functions of slit locations of a source in the lithographic projection apparatus.
22. A computer program product comprising a computer readable medium having instructions recorded thereon, the instructions when executed by a computer implementing the method of any of the above claims.

The descriptions above are intended to be illustrative, not limiting. Thus, it will be apparent to one skilled in the art that modifications may be made to the embodiments as described without departing from the scope of the claims set out below.

What is claimed is:
1. A method comprising:
determining, by a hardware computer device, a scattering function of a patterning device using one or more scattering functions of feature elements of one or more features of the patterning device, the one or more scattering functions of feature elements including one or more scattering functions that characterize scattering of incident radiation fields at a plurality of incident angles on the feature elements, wherein the scattering function of the patterning device is calculated by sum- ming products or convolutions of the one or more scattering functions of the feature elements, and one or more filter functions that depend on locations of the feature elements on the patterning device;

calculating, by the computer device, a scattered radiation field of the patterning device expected in a lithographic projection apparatus from the scattering function of the patterning device and an incident radiation field having a chief ray angle that is oblique to the patterning device; and storing in a non-transitory computer-readable medium and/or providing to a lithographic projection apparatus, data and/or instructions based on the scattered radiation field, where the data and/or instructions, or information derived therefrom, are configured for design, control and/or modification of a physical manufacturing process involving use of the patterning device in a lithographic projection apparatus and/or for design, control and/or modification of a physical object or apparatus to be used in the manufacturing process.

2. The method of claim 1, wherein the feature elements are selected from: edges, areas, corners, corners-in-proximity, edges-in-proximity, or any combination selected therefrom.

3. The method of claim 1, wherein the one or more scattering functions of feature elements include one or more scattering functions that characterize one or more effects selected from: a shadowing effect, pattern-dependent best focus shift, pattern shift or any combination selected therefrom.

4. The method of claim 3, wherein one or more scattering functions characterize shadowing effect and the shadowing effect is asymmetric.

5. The method of claim 3, wherein one or more scattering functions characterize pattern shift and the pattern shift comprises a global pattern shift and/or pattern-dependent pattern shift.

6. The method of claim 3, wherein one or more scattering functions characterize pattern shift and the pattern shift is caused by an incident radiation field at different locations on the patterning device having different incident angles.

7. The method of claim 1, further comprising selecting a plane on an optical path of the lithographic projection apparatus as an object plane of projection optics of the lithographic projection apparatus, such that global pattern shift is essentially zero.

8. The method of claim 1, wherein the one or more filter functions are functions of slit locations in the lithographic projection apparatus.

9. A computer program product comprising a non-transitory computer readable medium having instructions recorded thereon, the instructions when executed by a computer implementing the method of claim 1.

10. The method of claim 1, further comprising calculating a radiation field in a resist layer on a substrate being exposed in the lithographic projection apparatus.

11. The method of claim 1, wherein the scattered radiation field comprises radiation with a wavelength in the extreme ultraviolet band.

12. A method comprising:

determining, by a hardware computer device, a scattering function of a patterning device using one or more scattering functions of feature elements of one or more features of the patterning device, wherein the one or more scattering functions of feature elements and/or the scattering function of the patterning device characterizes a mask defocus between an object plane of a projection system arranged to receive radiation from the patterning device and a plane located at the top of the one or more features of the patterning device; and calculating, by the computer device, a scattered radiation field of the patterning device expected in a lithographic projection apparatus, from the scattering function of the patterning device and an incident radiation field; and storing in a non-transitory computer-readable medium and/or providing to a lithographic projection apparatus, data and/or instructions based on the scattered radiation field, where the data and/or instructions, or information derived therefrom, are configured for design, control and/or modification of a physical manufacturing process involving use of the patterning device in a lithographic projection apparatus and/or for design, control and/or modification of a physical object or apparatus to be used in the manufacturing process.

13. The method of claim 12, wherein at least one of the one or more features is a three-dimensional feature.

14. The method of claim 12, wherein one or more scattering functions characterize scattering of incident radiation fields at a plurality of incident angles on the feature elements.

15. The method of claim 12, wherein the scattered radiation field comprises radiation with a wavelength in the extreme ultraviolet band.

16. The method of claim 12, wherein the scattering function of the patterning device is calculated by summing products or convolutions of the one or more scattering functions of the feature elements, and one or more filter functions that depend on locations of the feature elements on the patterning device.

17. A method comprising:

determining, by a hardware computer device, a scattering function of a patterning device using one or more scattering functions of feature elements of one or more features of the patterning device, wherein the one or more scattering functions characterize secondary scattering among the one or more features, the secondary scattering comprising radiation scattered from one or more features that has been scattered by one or more other features; and calculating, by the computer device, a scattered radiation field of the patterning device expected in a lithographic projection apparatus from the scattering function of the patterning device and an incident radiation field; and storing in a non-transitory computer-readable medium and/or providing to a lithographic projection apparatus, data and/or instructions based on the scattered radiation field, where the data and/or instructions, or information derived therefrom, are configured for design, control and/or modification of a physical manufacturing process involving use of the patterning device in a lithographic projection apparatus and/or for design, control and/or modification of a physical object or apparatus to be used in the manufacturing process.

18. The method of claim 17, wherein at least one of the one or more features is a three-dimensional feature.

19. The method of claim 17, wherein the one or more scattering functions characterize scattering of incident radiation fields at a plurality of incident angles on the feature elements.

20. The method of claim 17, wherein the one or more scattering functions of feature elements and/or the scattering function of the patterning device characterizes a mask defocus between an object plane and a plane located at the top of the one or more features of the patterning device.

* * * * *